(12) United States Patent
Vummidi Murali et al.

(10) Patent No.: US 11,305,984 B2
(45) Date of Patent: *Apr. 19, 2022

(54) WATER PROOFING AND WATER DETECTION SCHEMES FOR MEMS-BASED ENVIRONMENTAL SENSING DEVICES

(71) Applicant: Apple Inc., Cupertino, CA (US)

(72) Inventors: Krishna Prasad Vummidi Murali, Sunnyvale, CA (US); Kuolung Lei, San Jose, CA (US); Richard Yeh, Los Altos, CA (US); Yun X. Ma, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 46 days.

This patent is subject to a terminal disclaimer.

(21) Appl. No.: 16/831,706

(22) Filed: Mar. 26, 2020

(65) Prior Publication Data

US 2020/0223686 A1 Jul. 16, 2020

Related U.S. Application Data

(62) Division of application No. 16/147,537, filed on Sep. 28, 2018, now Pat. No. 10,640,367.

(60) Provisional application No. 62/566,284, filed on Sep. 29, 2017.

(51) Int. Cl.
    *B81B 7/00* (2006.01)
    *B81C 1/00* (2006.01)

(52) U.S. Cl.
    CPC .......... *B81B 7/0058* (2013.01); *B81B 7/0029* (2013.01); *B81B 7/0077* (2013.01); *B81C 1/0023* (2013.01); *B81B 2201/0214* (2013.01); *B81B 2201/0264* (2013.01); *B81B 2201/0278* (2013.01); *B81B 2203/0127* (2013.01); *B81B 2203/04* (2013.01); *B81B 2207/012* (2013.01); *B81B 2207/096* (2013.01); *B81C 2203/0136* (2013.01); *B81C 2203/0792* (2013.01)

(58) Field of Classification Search
    CPC ............ B81B 7/0058; B81B 2207/096; B81B 2201/0214; B81B 2201/0264; B81B 2207/012; B81B 2203/0127; B81B 2203/04; B81B 2201/0278; B81B 7/0077; B81B 7/0029; B81C 1/0023; B81C 2203/0136; B81C 2203/0792
    See application file for complete search history.

(56) References Cited

U.S. PATENT DOCUMENTS

| | | | |
|---|---|---|---|
| 10,640,367 B2 * | 5/2020 | Vummidi Murali | B81B 7/0058 |
| 2014/0061892 A1 * | 3/2014 | Ziglioli | B81C 1/00333 257/704 |
| 2015/0274515 A1 * | 10/2015 | Bowles | B81B 7/02 257/415 |

\* cited by examiner

Primary Examiner — Victor A Mandala
(74) Attorney, Agent, or Firm — Baker & Hostetler LLP (57) ABSTRACT

A waterproofed environmental sensing device with water detection provisions includes an environmental sensor to sense one or more environmental properties. The device further includes an electronic integrated circuit implemented on a substrate and coupled to the environmental sensor via a wire bonding. An air-permeable cap structure is formed over the environmental sensor, and a protective layer is formed over the wire bonding to protect the wire bonding against damage.

14 Claims, 8 Drawing Sheets

WATER PROOFING AND WATER DETECTION SCHEMES FOR MEMS-BASED ENVIRONMENTAL SENSING DEVICES

CROSS-REFERENCE TO RELATED APPLICATIONS

This application is a divisional of the U.S. patent application Ser. No. 16/147,537 application that claims the benefit of priority under 35 U.S.C. § 119 from U.S. Provisional Patent Application 62/566,284 filed Sep. 29, 2017, which are incorporated herein by reference in their entirety.

TECHNICAL FIELD

The present description relates generally to sensor technology, and more particularly, to water proofing and water detection schemes for mems-based environmental sensors.

BACKGROUND

Portable communication devices (e.g., smart phones and smart watches) are becoming increasingly waterproof by implementing electronic components inside sealed enclosures. However, certain components such as environmental (e.g., pressure, temperature and humidity) sensors, gas sensors, particulate matter (PM) sensors, speakers and microphones rely on physical interaction with the external environment for proper functionality. The physical interaction can be through a small opening provided on the enclosure. Exposure to the environmental aggressors such as fresh and salt water, skin oil, dust, sunscreens can cause a variety of system integration problems.

Port occlusion by water or debris is among the problems, which can result in degradation in user experience, poor device reliability and/or device misreading. As an example, the accuracy of pressure sensors, when detecting external pressure changes, can be greatly reduced if residual water occludes the sensor surface resulting in misreading. As the water evaporates (which can take hours), false pressure-change signals can be detected. For example, when pressure is sensed for measuring height to count the number of stairs climbed by a user, the false pressure-change signals can indicate false or missed flight of stairs, which degrades the user experience. The existing gel-based sensors (e.g., pressure sensors), although may work for their intended applications, but may have a number of shortcomings. For example, the sensor temperature coefficient offset (TCO) may change from the time of testing to the time of integration into a system and continue to drift during the product lifetime. Further, strain induced effects are not addressed in the existing solutions.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects, the subject technology is directed to a waterproofed sensor that can detect environmental aggressors such as water, oil or other liquids. The sensor of the subject technology is an electro-mechanical system (MEMS)-based environmental sensor that can operate without a sensor gel. In certain implementations that the disclosed sensor device includes some amount of sensor gel, the sensor device can be equipped with one or more capacitive elements that enable detection of presence of environmental aggressors above the sensor gel. The subject technology enables addressing shortcomings of the existing solution such as the sensor temperature coefficient offset (TCO) change before sensor production and throughout the product lifetime. Further, strain induced effects present in the existing solutions are mitigated by strain isolation, as described in more detail herein. The subject technology allows achieving waterproofing and clogging-prevention of electronic devices that require exposure to the environment by implementing water detection in the sensor package. The disclosed solution can be applied to electronic devices and components that operate based on being exposed to the environment such as pressure sensors, temperature and humidity sensors, gas sensors, particulate matter (PM) sensors, speakers and microphones in portable devices (e.g., potable communication devices such as smart phones and smart watches).

The subject technology can mitigate device degradation and misreading caused by port occlusion in contact with environmental aggressors such as fresh and salt water, skin oil, dust, sunscreen, and other environmental aggressors. In some implementations, the subject environmental sensor (e.g., pressure sensor) can sense one or more environmental properties including pressure, temperature or humidity. The disclosed environmental sensor is coupled to an electronic integrated circuit implemented on a substrate via a wire bonding. An air-permeable cap structure is formed over the environmental sensor, and a protective layer is formed over the wire bonding to protect the wire bonding against a potential damage, for example, mechanical or environmental damages.

Figure 1:
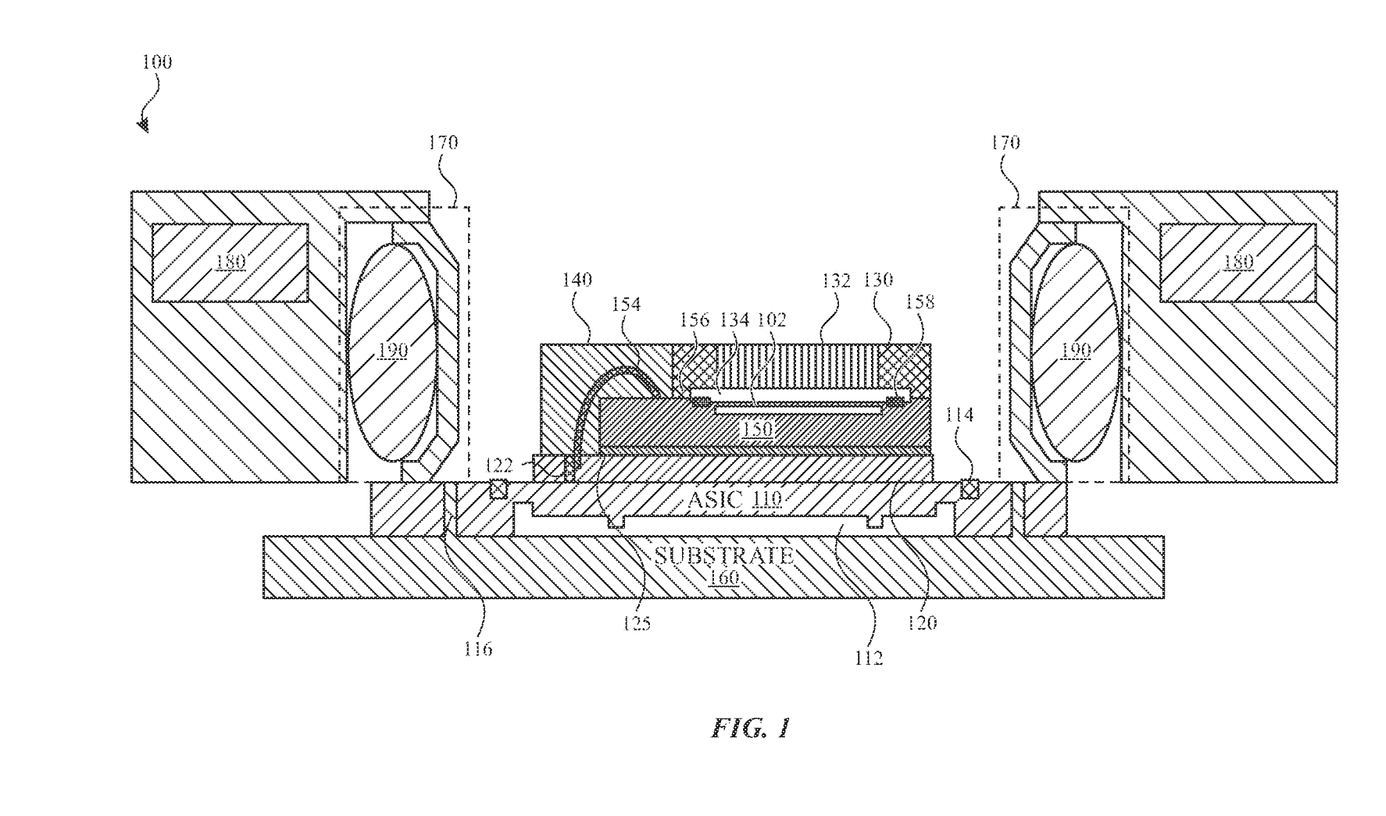
FIG. 1 is a schematic diagram illustrating an example of a waterproofed environmental sensor with water detection provisions, in accordance with one or more aspects of the subject technology.

FIG. 1 is a schematic diagram illustrating an example of a waterproofed environmental sensing device 100 with water detection provisions, in accordance with one or more aspects of the subject technology. The waterproofed environmental sensing device 100 includes, but is not limited to, a sensor 102, an application specific integrated circuit (ASIC) 110, an interposer 120, an air-permeable cap structure 130, a wire bond 154, a substrate 160 and a protective layer 140 encapsulating the wire bond 154. In some implementations, the sensor 102 may be an electro-mechanical system (MEMS)-based pressure sensor, implemented as a membrane in a MEMS structure 150. In some embodiments, the sensor 102 is a miniature environmental sensor capable of sensing a gas (e.g., carbon dioxide, carbon monoxide, ozone, volatile organic compounds (VOCs)) or an environmental parameter including pressure, temperature or humidity.

The ASIC 110, may be an electronic integrated circuit that may, for example, provide bias supply for sensor 102 and can perform processing of the signals from the sensor 102. The ASIC 110 can include, for instance, a microcontroller and associated software and firmware among other components. The sensor 102 is coupled via a wire bonding 154 to the ASIC 110 through the interposer 120, for example, via a through-silicon via (TSV) 122 of the interposer 120. The wire bonding 154 is protected from a potential damage using the protective layer 140, which can be made of, for example, a plastic material or other suitable material that can encapsulate the wire bonding 154 to electrically isolate and mechanically protect the wire bonding 154, as the sensing device 100 does not use sensor gel in the sensor structure. In one or more implementations, the MEMS structure 150 and the ASIC 110 are not separate pieces and can be integrated into a single die.

The air-permeable cap structure 130 can be made of a suitable material such as silicon, silicon carbide or other suitable material. The air-permeable cap structure 130 can have a porous section 132 including vents for allowing the air to reach the sensor 102, while preventing environmental aggressors such as water, oil and other unwanted substances to enter the sensing volume 134 under the porous section 132. The porous section 132 may include a microporous structure formed on the air-permeable cap structure 130. In some embodiments, the air-permeable cap structure 130 can be covered with a hydrophobic layer such as a parylene coating to further protect the sensor 102 against environmental aggressors such as water and oil.

The MEMS structure 150 may include capacitive elements 158 implemented (e.g., as traces) on the MEMS structure 150 as a detection means for detecting presence of the environmental aggressors such as water and oil in the sensing volume 134. In some embodiments, the MEMS structure 150 can also include heating elements 156 (e.g., resistive routings) implemented on the MEMS structure 150 to heat up the sensor 102 and the sensing volume 134. The heat from the heating elements 156 can be utilized for temperature coefficient offset (TCO) calibration of the sensor 102. The TCO can shift during assembly and during the lifetime of the sensing device 100, which is a weak point of the existing gel-based pressure sensors and is mitigated by the subject technology. The heat from the heating elements 156 can further be used to evaporate any water in the sensing volume 134. The heating elements 156 may operate based on a feedback from the capacitive elements 158.

In some implementations, the ASIC 110 may be used as a package substrate and can provide strain isolation for the sensor 102 through a cavity 112 embedded in the ASIC 110. The strain isolation may also be provided by the MEMS structure 150, which is placed over the interposer 120 that is flip-chip bonded to the ASIC 110. The MEMS structure 150 may be coupled to the interposer 120 through a die attach film 125 to the interposer 120. In some implementations, the MEMS structure 150 incorporates resistive routing for self-heating and TCO calibration. In one or more implementations, the heat from the MEMS structure 150 can be used to eject any water from the air-permeable cap structure 130 and to prevent blocking, by tiny particles, of small holes of the air-permeable cap structure 130. In some implementations, the ASIC 110 may include capacitive elements 114 implemented using, for example, a top metal of the ASIC 110 and one or more TSVs 116. The capacitive elements 114 can detect presence of water, oil or other liquids in the space above the ASIC 110 and within the wall structure 170 of the sensing device 100. The wall structure 170 attaches the sensing device 100 to a system housing 180 of a host system (e.g., a consumer electronic device such as a smart phone or a smart watch) and includes an o-ring 190. The substrate 160 can be a flexible substrate (e.g., Flex) or a printed circuit board (PCB) and is different from the package substrate. In one or more implementations, the substrate 160 may be semiconductor substrate and can be made of a material such as silicon, silicon oxide, silicon carbide or other substrate materials.

Figure 2:
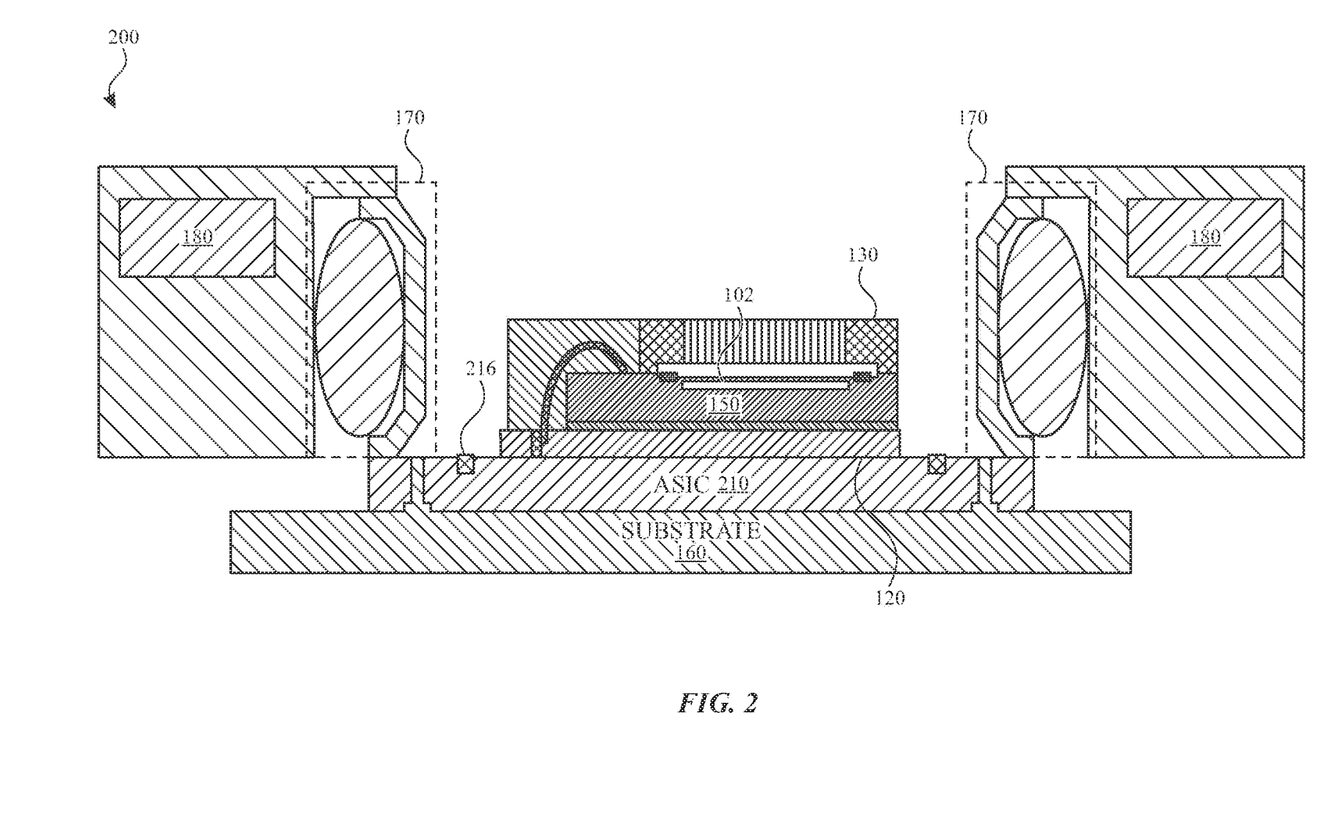
FIG. 2 is a schematic diagram illustrating an example of a waterproofed environmental sensor with water detection provisions, in accordance with one or more aspects of the subject technology.

FIG. 2 is a schematic diagram illustrating an example of a waterproofed environmental sensing device 200 with water detection provisions, in accordance with one or more aspects of the subject technology. The waterproofed environmental sensing device 200 is similar to the waterproofed environmental sensing device 100 of FIG. 1. For example, the waterproofed environmental sensing device 200 includes the sensor 102 implemented as a membrane in the MEMS structure 150, the air-permeable cap structure 130, the ASIC 210, the substrate 160 and the wall structure 170 and in secured to the system housing 180 of the host device. The ASIC 210 is different from the ASIC 110 of FIG. 1, as the ASIC 210 does not include any strain isolation provisions such as the cavity 112 of FIG. 1. The ASIC 210 also includes heating elements 216 implemented by resistive traces (e.g., top metal layer). Otherwise, all other components of the waterproofed environmental sensing device 200 of FIG. 2 have similar structure and functionalities as discussed above with respect to FIG. 1. The strain isolation, in the implementation of FIG. 2 is provided by the MEMS structure 150, which is implemented over the interposer 120 that is flip-chip bonded to the ASIC 210.

Figure 3:
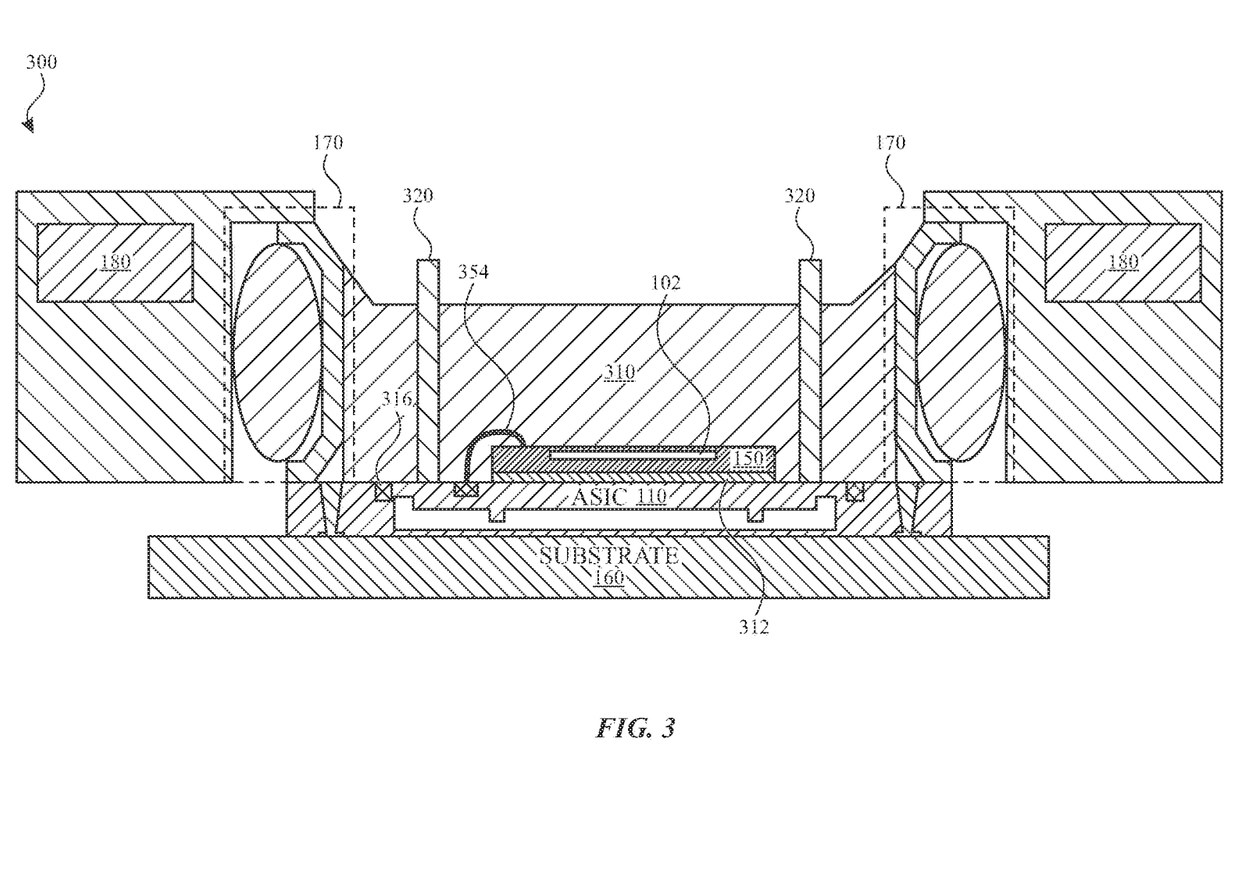
FIG. 3 is a schematic diagram illustrating an example of a gel-waterproofed environmental sensing device with water detection provisions, in accordance with one or more aspects of the subject technology.

FIG. 3 is a schematic diagram illustrating an example of a gel-waterproofed environmental sensing device 300 with water detection provisions, in accordance with one or more aspects of the subject technology. The gel-waterproofed environmental sensing device 300 is similar to the waterproofed environmental sensing device 100 of FIG. 1, except for the additional sensor gel 310 that replaces the air-permeable cap structure 130 of FIG. 1, and the passive elements 320 (e.g., capacitors).

For example, the gel-waterproofed environmental sensing device 300 includes the sensor 102 implemented as a membrane in the MEMS structure 150, the ASIC 110, the substrate 160 and the wall structure 170 secured to the system housing 180 of the host device. The wall structure 170 forms an enclosure for the gel-waterproofed environmental sensing device 300. In one or more implementations, the enclosure is partially filled with the sensor gel 310. The number of passive elements 320 (e.g., capacitors) are not limited to and may change in various implementations. The passive elements 320 are partially exposed above the sensor gel 310 and are coupled to the ASIC 110 using surface mounted technology (SMT). The passive elements 320 can be made, for example, of a conductor strip (e.g., a metal such as copper, aluminum, titanium and other metals) covered with an insulating material. The passive elements 320 can detect presence of water, oil or other liquids above the sensor gel 310. The wire bonding 354 coupling the MEMS structure 150 to the ASIC 110 are covered by the sensor gel 310 and does not need the encapsulation, as provided by the protection layer 140 of FIG. 1. In one or more implementations, the wire bonding can be replaced by through-silicon-via (TSV) to connect the MEMS structure 150 to the ASIC 110.

The MEMS structure 150 mounted on the ASIC 110 using an isolation membrane 312 made of a material including, for example, silicone rubber. The ASIC 110, which is used as a package substrate for the device structure, includes strain isolation provisions as described above with respect to FIG. 1 and further includes heating elements 316 implemented using resistive routings, for instance, the top metal of the ASIC 110. The heating elements 316 can provide heat for TCO calibration as well as for evaporating water, oil or other liquids accumulated over the sensor gel 310.

Figure 4:
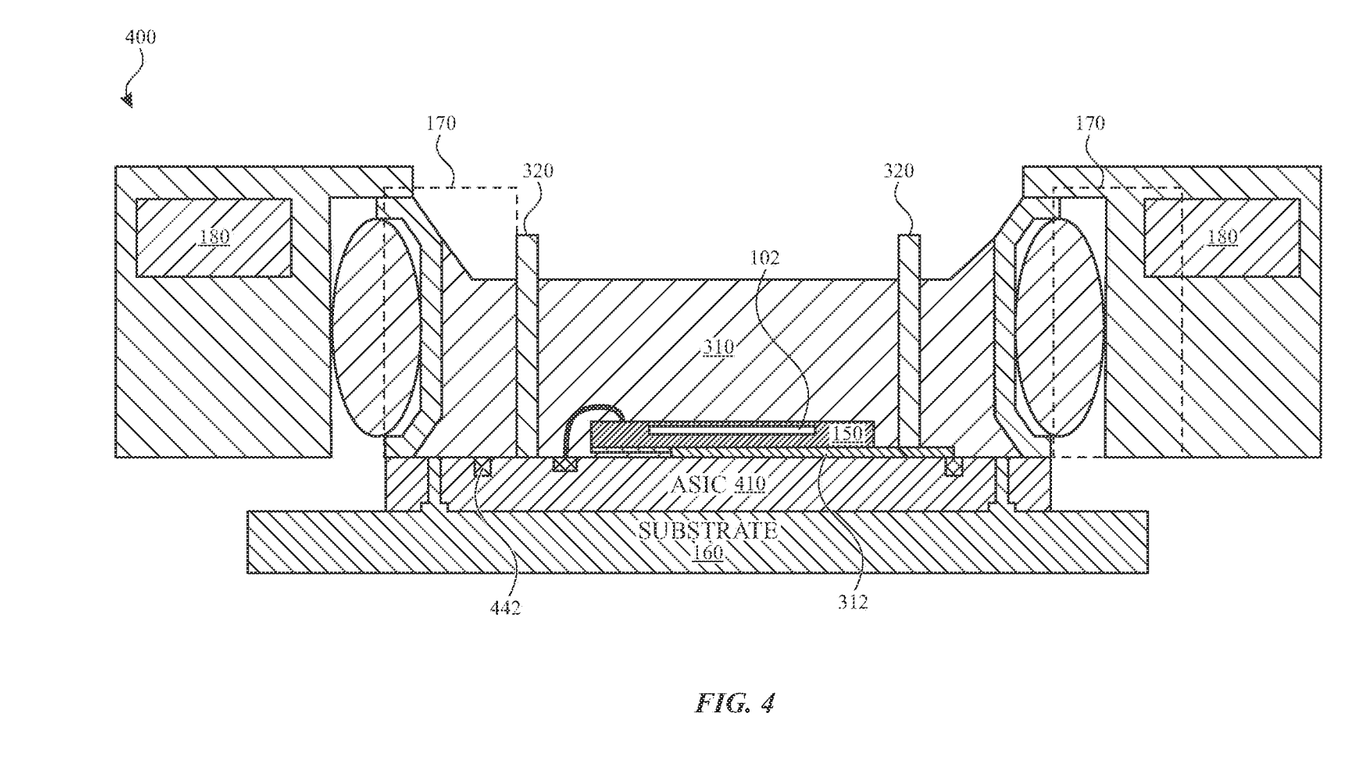
FIG. 4 is a schematic diagram illustrating an example of a gel-waterproofed environmental sensing device with water detection provisions, in accordance with one or more aspects of the subject technology.

FIG. 4 is a schematic diagram illustrating an example of a gel-waterproofed environmental sensing device 400 with water detection provisions, in accordance with one or more aspects of the subject technology. The gel-waterproofed environmental sensing device 400 is similar to the gel-waterproofed environmental sensing device 300 of FIG. 3, except that the ASIC 510 of FIG. 4 does not includes strain isolation provisions. For example, the gel-waterproofed environmental sensing device 400 includes the sensor 102 implemented as a membrane in the MEMS structure 150, the ASIC 510, the passive elements 320, the sensor gel 310, the substrate 160 and the wall structure 170 secured to the system housing 180 of the host device. The ASIC 410 is used as the package substrate and includes TSVs 442 to electrically couple to the substrate 160. The strain isolation is provided by the isolation membrane 312 made of a material including, for example, silicone rubber.

Figure 5:
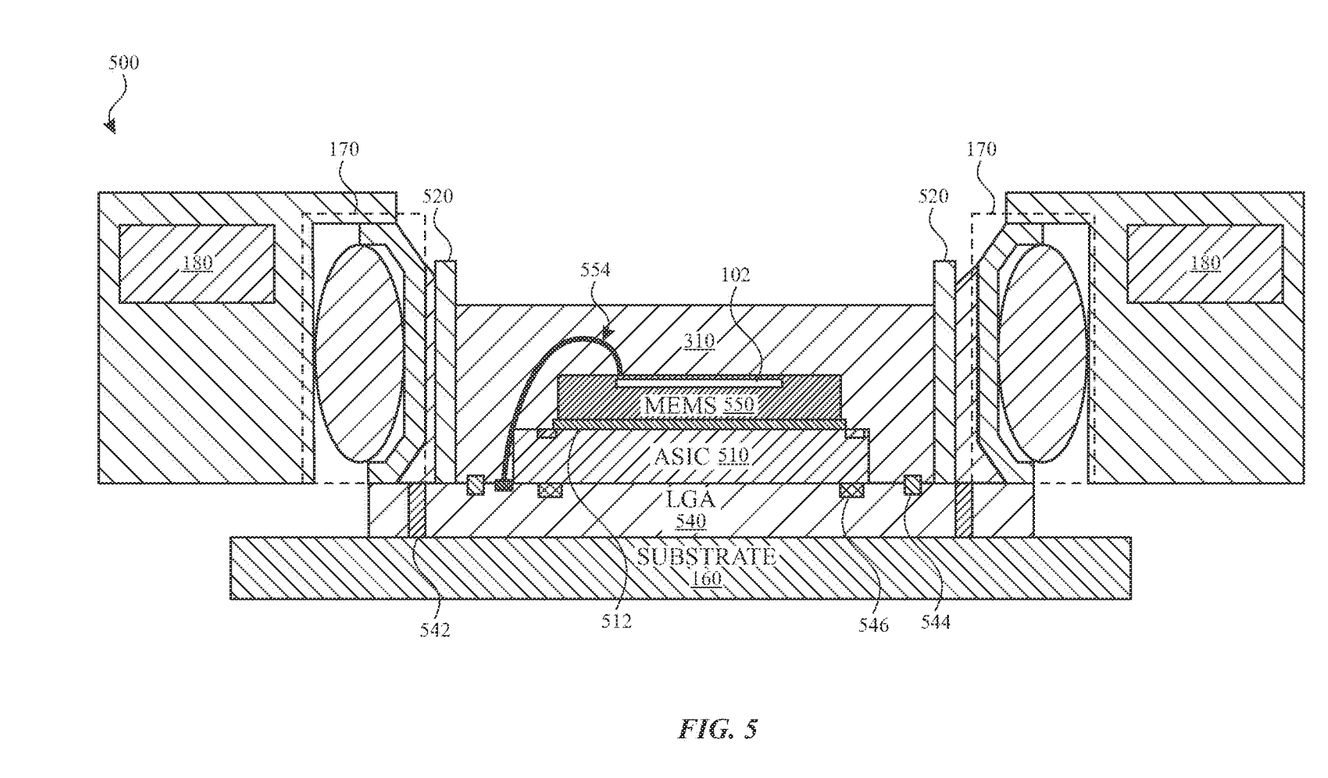
FIG. 5 is a schematic diagram illustrating an example of a gel-waterproofed environmental sensing device with water detection provisions implemented over a land grid array (LGA), in accordance with one or more aspects of the subject technology.

FIG. 5 is a schematic diagram illustrating an example of a gel-waterproofed environmental sensing device 500 with water detection provisions implemented over a land grid array (LGA), in accordance with one or more aspects of the subject technology. The gel-waterproofed environmental sensing device 500 is similar to the gel-waterproofed environmental sensing device 400 of FIG. 4, except that the ASIC 510 of FIG. 5 is implemented over a land grid array (LGA) layer 540.

For example, The gel-waterproofed environmental sensing device 500 includes the sensor 102 implemented as a membrane in the MEMS structure 550, the ASIC 510, the passive elements 520, the sensor gel 310, the substrate 160 and the wall structure 170 secured to the system housing 180 of the host device. The ASIC 510 is coupled, for example, via flip-chip bonding to conductive traces 546 of the LGA 540, which is used as the package substrate and includes TSVs 542 to electrically couple to the substrate 160. The strain isolation is provided by the isolation membrane 512 made of a material including, for example, silicone rubber. The sensor gel 310 is similar to the sensor gel 310 of FIG. 4 and covers the wire bonding 554 and portions of the passive elements 520, which are coupled to the LGA 540 via SMT. The LGA 540 includes resistive routings 544 used for heating the sensor gel for evaporation of water, oil or other liquids over the sensor gel 310. The resistive routings 544 can further be used to perform TCO calibration of the sensor 102.

Figure 6:
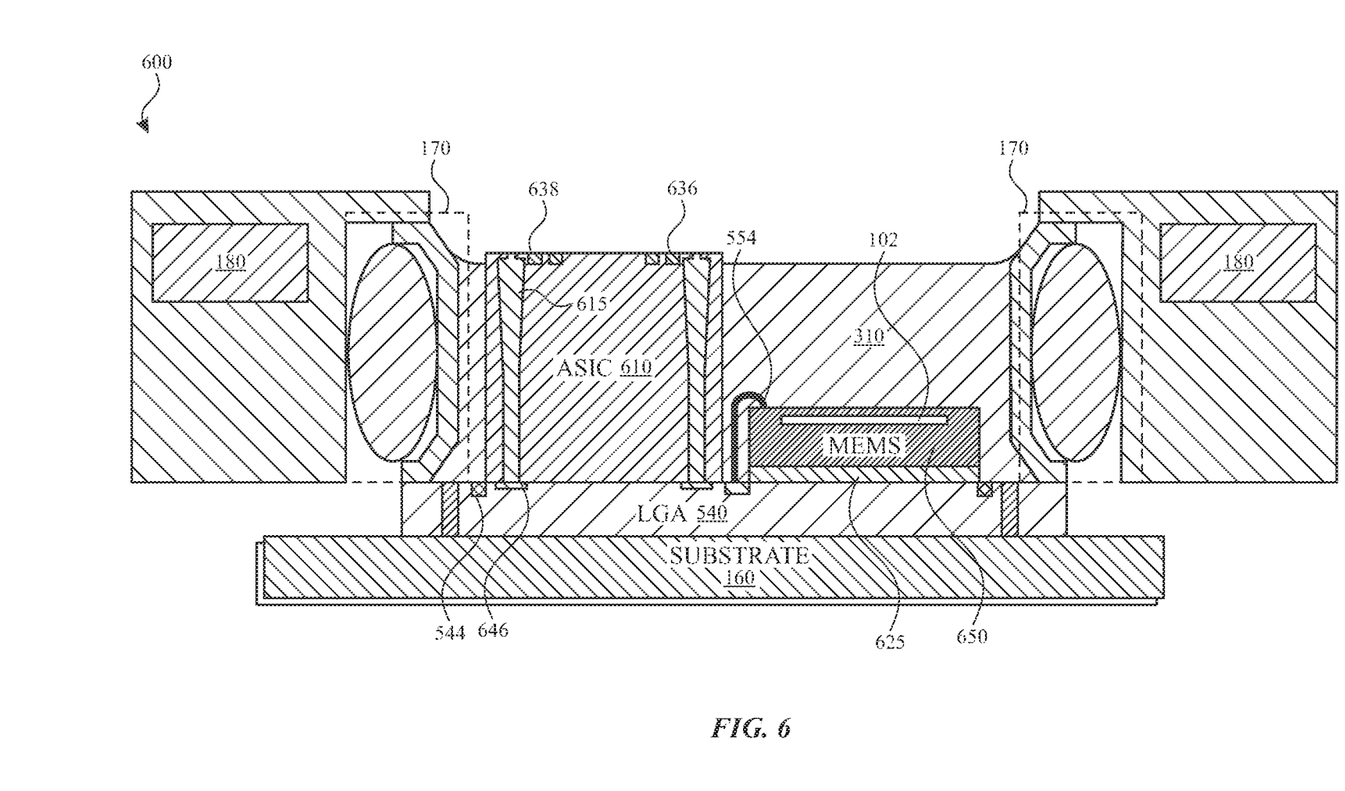
FIG. 6 is a schematic diagram illustrating an example of a gel-waterproofed environmental sensing device with water detection provisions implemented over a land grid array (LGA), in accordance with one or more aspects of the subject technology.

FIG. 6 is a schematic diagram illustrating an example of a gel-waterproofed environmental sensing device 600 with water detection provisions implemented over a land grid array (LGA), in accordance with one or more aspects of the subject technology. The gel-waterproofed environmental sensing device 600 is similar to the gel-waterproofed environmental sensing device 500 of FIG. 5, except that the ASIC 610 of FIG. 6 is implemented side-by-side with a MEMS structure 650 over the land grid array (LGA) layer 540 and the passive elements 520 of FIG. 5 are not used.

For example, the gel-waterproofed environmental sensing device 600 includes the sensor 102 implemented as a membrane in the MEMS structure 650, the ASIC 610, the sensor gel 310, the substrate 160 and the wall structure 170 secured to the system housing 180 of the host device. The ASIC 610 is coupled, for example, via TSVs 615 to conductive traces 646 of the LGA 540. The ASIC 610 is thicker than normal and is partially exposed above the sensor gel 310. In some implementations, the exposed surface of the ASIC 610 includes resistive routings 636 and capacitive elements 638 that are formed using conductive traces such as top metal of the ASIC 610. The capacitive elements can detect water, oil or other liquids accumulated over the ASIC 610 and the resistive routings 636 can be controlled by control signals based on a feedback from the capacitive elements 638 to heat up and evaporate the liquids.

The LGA 540 is used as the package substrate and is formed on the substrate 160. The strain isolation is provided by the isolation membrane 625 made of a material including, for example, silicone rubber and used between the MEMS structure 650 and the LGA 540. The sensor gel 310 is similar to the sensor gel 310 of FIG. 4 and covers the wire bonding 554. The LGA 540 includes the resistive routings 544 used for heating the sensor gel for evaporation of water, oil or other liquids over the sensor gel 310. The resistive routings 544 can further be used to perform TCO calibration of the sensor 102.

Figure 7:
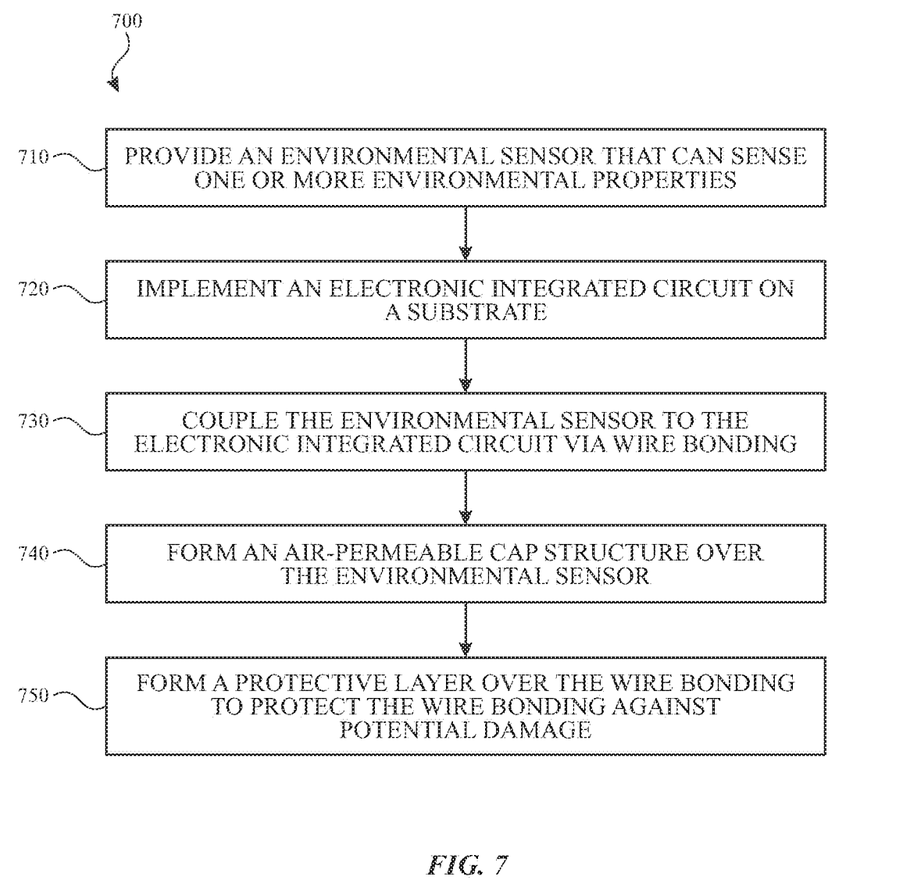
FIG. 7 is a flow diagram illustrating a process of providing of a waterproofed environmental sensing device with water detection provisions, in accordance with one or more aspects of the subject technology.

FIG. 7 is a flow diagram illustrating a process 700 of providing of a waterproofed environmental sensing device (e.g., 100 of FIG. 1) with water detection provisions, in accordance with one or more aspects of the subject technology. For explanatory purposes, the process 700 is primarily described herein with reference to the waterproofed environmental sensing device 100 of FIG. 1. However, the process 700 is not limited to the waterproofed environmental sensing device 100 of FIG. 1, and one or more blocks (or operations) of the process 700 may be performed by one or more other components of the waterproofed environmental sensing device 100 of FIG. 1 or other environmental sensing device disclosed herein. Further, for explanatory purposes, the blocks of the example process 700 are described herein as occurring in serial, or linearly. However, multiple blocks of the example process 700 may occur in parallel. In addition, the blocks of the example process 700 need not be performed in the order shown and/or one or more of the blocks of the example process 700 need not be performed.

The process 700 may include providing an environmental sensor (e.g., 100 of FIG. 1) that can sense one or more environmental properties (710). An electronic integrated circuit (e.g., 110 of FIG. 1) can be implemented on a substrate (e.g., 160 of FIG. 1) (720). The environmental sensor may be coupled to electronic integrated circuit via wire bonding (e.g., 154 of FIG. 1) (730). An air-permeable cap structure (e.g., 130 of FIG. 1) may be formed over the environmental sensor (740). A protective layer (e.g., 140 of FIG. 1) may be formed over the wire bonding to protect the wire bonding against damage (750).

Figure 8:
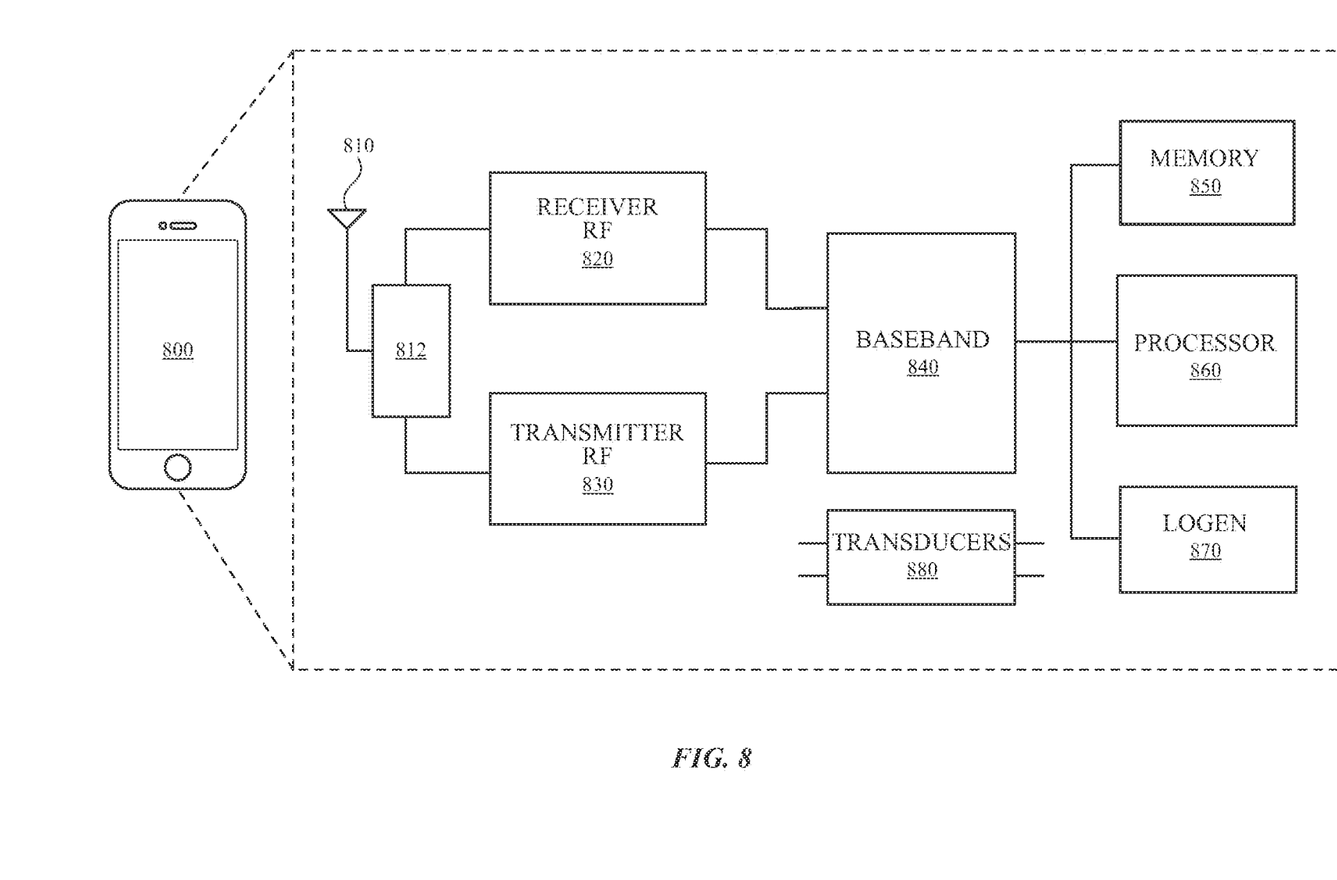
FIG. 8 is a block diagram illustrating an example wireless communication device, within which one or more environmental sensing devices of the subject technology can be integrated.

FIG. 8 is a block diagram illustrating an example wireless communication device, within which one or more environmental sensing devices of the subject technology can be integrated. The wireless communication device 800 may comprise a radio-frequency (RF) antenna 810, a receiver 820, a transmitter 830, a baseband processing module 840, a memory 850, a processor 860, a local oscillator generator (LOGEN) 870 and one or more transducers 880. In various embodiments of the subject technology, one or more of the blocks represented in FIG. 8 may be integrated on one or more semiconductor substrates. For example, the blocks 820-870 may be realized in a single chip or a single system on a chip, or may be realized in a multi-chip chipset.

The receiver 820 may comprise suitable logic circuitry and/or code that may be operable to receive and process signals from the RF antenna 810. The receiver 820 may, for example, be operable to amplify and/or down-convert received wireless signals. In various embodiments of the subject technology, the receiver 820 may be operable to cancel noise in received signals and may be linear over a wide range of frequencies. In this manner, the receiver 820 may be suitable for receiving signals in accordance with a variety of wireless standards, Wi-Fi, WiMAX, Bluetooth, and various cellular standards. In various embodiments of the subject technology, the receiver 820 may not require any SAW filters and few or no off-chip discrete components such as large capacitors and inductors.

The transmitter 830 may comprise suitable logic circuitry and/or code that may be operable to process and transmit signals from the RF antenna 810. The transmitter 830 may, for example, be operable to up-convert baseband signals to RF signals and amplify RF signals. In various embodiments of the subject technology, the transmitter 830 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 830 may be operable to provide signals for further amplification by one or more power amplifiers.

The duplexer 812 may provide isolation in the transmit band to avoid saturation of the receiver 820 or damaging parts of the receiver 820, and to relax one or more design requirements of the receiver 820. Furthermore, the duplexer 812 may attenuate the noise in the receive band. The duplexer may be operable in multiple frequency bands of various wireless standards.

The baseband processing module 840 may comprise suitable logic, circuitry, interfaces, and/or code that may be operable to perform processing of baseband signals. The baseband processing module 840 may, for example, analyze received signals and generate control and/or feedback signals for configuring various components of the wireless communication device 800, such as the receiver 820. The baseband processing module 840 may be operable to encode, decode, transcode, modulate, demodulate, encrypt, decrypt, scramble, descramble, and/or otherwise process data in accordance with one or more wireless standards.

The processor 860 may comprise suitable logic, circuitry, and/or code that may enable processing data and/or controlling operations of the wireless communication device 800. In this regard, the processor 860 may be enabled to provide control signals to various other portions of the wireless communication device 800. The processor 860 may also control transfers of data between various portions of the wireless communication device 800. Additionally, the processor 860 may enable implementation of an operating system or otherwise execute code to manage operations of the wireless communication device 800.

The memory 850 may comprise suitable logic, circuitry, and/or code that may enable storage of various types of information such as received data, generated data, code, and/or configuration information. The memory 850 may comprise, for example, RAM, ROM, flash, and/or magnetic storage. In various embodiment of the subject technology, information stored in the memory 850 may be utilized for configuring the receiver 820 and/or the baseband processing module 840.

The local oscillator generator (LOGEN) 870 may comprise suitable logic, circuitry, interfaces, and/or code that may be operable to generate one or more oscillating signals of one or more frequencies. The LOGEN 870 may be operable to generate digital and/or analog signals. In this manner, the LOGEN 870 may be operable to generate one or more clock signals and/or sinusoidal signals. Characteristics of the oscillating signals such as the frequency and duty cycle may be determined based on one or more control signals from, for example, the processor 860 and/or the baseband processing module 840.

In operation, the processor 860 may configure the various components of the wireless communication device 800 based on a wireless standard according to which it is desired to receive signals. Wireless signals may be received via the RF antenna 810 and amplified and down-converted by the receiver 820. The baseband processing module 840 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 850, and/or information affecting and/or enabling operation of the wireless communication device 800. The baseband processing module 840 may modulate, encode, and perform other processing on audio, video, and/or control signals to be transmitted by the transmitter 830 in accordance with various wireless standards.

The one or more transducers 880 may include an environmental sensor of the subject technology, for example, shown in FIG. 1, 2, 3, 4, 5, or 6 and described above. The environmental sensor of the subject technology can be readily integrated into the wireless communication device 800, in particular when the wireless communication device 800 is a smart mobile phone or a smart watch.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A device comprising:
    an environmental sensor embedded in an electro-mechanical system (MEMS) structure;
    an electronic integrated circuit (IC); and
    one or more passive elements,
    wherein:
        the device is partially enclosed in an enclosure,
        the enclosure is at least partially filled with a sensor gel, and
        the one or more passive elements are at least partially exposed above the sensor gel.

2. The device of claim 1, wherein the one or more passive elements comprise capacitive elements and are coupled to the electronic IC, and wherein the passive elements are configured to detect presence of at least water and oil above the sensor gel.

3. The device of claim 2, wherein the electronic IC includes a strain isolation provision, and wherein the electronic IC includes resistive routings configured to allow TCO calibration.

4. The device of claim 2, further comprising a membrane configured to provide strain isolation, wherein the membrane is made of a material including silicone rubber.

5. The device of claim 4, wherein the environmental sensor is coupled to the electronic IC via a wire bonding, and wherein the membrane is formed between the MEMS structure and the electronic IC.

6. The device of claim 4, further comprising a land grid array (LGA) layer, wherein the MEMS structure is wire bonded to the LGA layer.

7. The device of claim 6, wherein at least one of the LGA layer or the electronic integrated circuit includes resistive-routing for TCO calibration.

8. A device comprising:
    an environmental sensor configured to sense one or more environmental properties;
    an integrated circuit (IC) coupled to the environmental sensor via a wire bonding;
    a protective layer formed over the wire bonding to protect the wire bonding against a potential damage; and
    interdigitated electrodes implementing capacitors capable of detecting environmental aggressors including water, and wherein the interdigitated electrodes are realized using a top metal layer and passivation.

9. The device of claim 8, further comprising an air-permeable cap structure formed over the environmental sensor and configured to protect a surface of the environmental sensor from environmental aggressors including water and oil.

10. The device of claim 9, wherein the air-permeable cap structure is made of a suitable material including silicon, and wherein the air-permeable cap structure includes a coated hydrophobic layer.

11. The device of claim 8, wherein the environmental sensor is formed in an electro-mechanical system (MEMS) structure and wire bonded to the IC through an interposer including through-silicon vias (TSVs).

12. The device of claim 11, wherein the MEMS structure is configured to provide strain isolation for the environmental sensor.

13. The device of claim 11, wherein the IC is used as a package substrate, wherein strain isolation provisions are implemented in at least one of the IC or the MEMS structure, and wherein the MEMS structure and the interposer are coupled to the IC via flip-chip bonding.

14. The device of claim 11, wherein the IC is implemented side-by-side with the MEMS structure and includes one or more capacitive elements configured to detect presence of at least water and oil.

* * * * *